(12) United States Patent
Schaeffer et al.

(10) Patent No.: US 7,398,491 B2
(45) Date of Patent: Jul. 8, 2008

(54) METHOD FOR FAST INCREMENTAL CALCULATION OF AN IMPACT OF COUPLED NOISE ON TIMING

(75) Inventors: Gregory M. Schaeffer, Poughkeepsie, NY (US); Alexander J. Suess, Hopewell Junction, NY (US); David J. Hathaway, Underhill, VT (US)

(73) Assignee: International Business Machines Corporation, Armonk, NY (US)

( * ) Notice: Subject to any disclaimer, the term of this patent is extended or adjusted under 35 U.S.C. 154(b) by 235 days.

(21) Appl. No.: 11/420,529

(22) Filed: May 26, 2006

(65) Prior Publication Data

US 2007/0277131 A1 Nov. 29, 2007

(51) Int. Cl.
*G06F 17/50* (2006.01)
(52) U.S. Cl. .................................... 716/4; 716/5; 716/6
(58) Field of Classification Search .................... 716/4, 716/5, 6
See application file for complete search history.

(56) References Cited

U.S. PATENT DOCUMENTS

| | | | |
|---|---|---|---|
| 5,508,937 A | 4/1996 | Abato et al. | |
| 5,636,372 A | 6/1997 | Hathaway et al. | |
| 6,314,546 B1 * | 11/2001 | Muddu | 716/5 |
| 6,353,917 B1 * | 3/2002 | Muddu et al. | 716/6 |
| 6,615,395 B1 | 9/2003 | Hathaway et al. | |
| 7,073,140 B1 * | 7/2006 | Li et al. | 716/4 |
| 7,111,260 B2 * | 9/2006 | Visweswariah | 716/6 |
| 2001/0010090 A1 * | 7/2001 | Boyle et al. | 716/2 |
| 2005/0066296 A1 * | 3/2005 | Visweswariah | 716/6 |
| 2005/0066297 A1 | 3/2005 | Kalafala et al. | |
| 2007/0143719 A1 * | 6/2007 | Chopra et al. | 716/4 |

* cited by examiner

*Primary Examiner*—Sun J Lin
(74) *Attorney, Agent, or Firm*—H. Daniel Schnurmann

(57) ABSTRACT

A method for incrementally calculating the impact of coupling noise on the timing of an integrated circuit (IC) having a plurality of logic stages by performing an initial timing analysis on the IC to provide a first determination of the impact of coupling noise on the timing. One or more design changes to the IC are then performed. In response to the design change, the impact of the coupling noise to the timing is calculated on the logic stage where the change was made and on the logic stages downstream thereof. The results of the calculations are then inputted to a timing analysis tool to adjust the delay and slew of each logic stage where the design change was made and to the logic stages downstream thereof.

18 Claims, 5 Drawing Sheets

DELAY OF VICTIM INCREASES

DELAY OF VICTIM DECREASES new K = f(new victim window/slew, frozen aggressor window/slew)

METHOD FOR FAST INCREMENTAL CALCULATION OF AN IMPACT OF COUPLED NOISE ON TIMING

BACKGROUND OF THE INVENTION

This invention is related to the electronic design of very large scale integrated circuits (VLSI), and more particularly to a static timing analysis that guarantees the functionality and performance of a VLSI chip.

Conventional static timing analysis normally assumes static loads and nets. Coupling in the form of interaction between adjacent wires causes disturbances that are not easily handled by a conventional static timing analysis. One reason is that coupling can prevent levelization of the logic network upon which static timing analysis algorithms depend.

Coupling capacitance occurs when two neighboring wires are in close proximity of each other. Depending on how the signals rise or fall on these wires, delay and slew change on the victim net (defined as the net whose switching is affected). Slew is the time it takes for a signal transition to occur, e.g., to rise from 10% of the supply voltage to 90% of the supply voltage. Referring to FIG. 1, the aggressor nets (defined as the nets whose switching affects the victim's delay) or neighboring nets, undergo an opposite transition than the victim net. Consequently, the delay and transition time of the victim net increases. As seen in FIG. 2, aggressor nets may also undergo a transition in the same direction as the victim. Consequently, the delay and transition time in the victim net may decrease. These changes in delay and slew can be significant, and properly accounting for them becomes a significant problem.

Calculating the magnitude of the impact of capacitive coupling on the delay and slew depends upon several factors, including (a) the amount of capacitance; (b) the switching windows of the victim and aggressor nets, i.e., the range of times during which the nets make a transition; (c) the transition times (slews) of the victim and aggressor nets; and (d) the voltage swings of the victim and aggressor. From the information of (b), (c), and (d), a K-factor is calculated. The K factor represents the amount by which the effect of the coupling capacitance on the net increases or decreases as a result of switching occurring on the net to which it is coupled. The K-factor is multiplied by the capacitance to increase the victim capacitance (causing an increase in delay and slew), or to decrease the victim capacitance (causing a decrease in delay and slew).

The basic K-factor is described in U.S. Pat. No. 6,615,395 to Hathaway et al., although the values of K referenced herein do not coincide with the K factor $K_{prior}$ used in the aforementioned patent, they rather correspond to $1-K_{prior}$ and $1+K_{prior}$. Therefore, the term $K_{prior}$ will preferably be used hereinafter to relate the current invention to this prior art.

The K-factor computation described in U.S. Pat. No. 6,615,395 is an iterative process. Initially, it starts with an assumption of worst-case K-factors when performing a timing analysis. In the first iteration, the worst-case timing is used to calculate the switching windows and determine new K-factors. The new K-factors are passed on to a timer, and a timing analysis is performed once again. In the second iteration, the updated timing results are used to calculate new switching windows, and thus new K-factors. Again, the new K-factors are transferred to the timer and the timing analysis is once again performed. This process continues until convergence is achieved, following a criterion determined by the user.

Optimization engines typically perform trial design changes, and call upon a timing analyzer to incrementally update the timing information to decide whether or not the change improves the design. A method of incremental timing analysis is described in U.S. Pat. No. 5,508,937 to Abato et al. Current solutions perform these operations without including the effects of the capacitive coupling on the timing. The solution outlined previously does not lend itself to incremental changes because the victim paths depend on the timing information of their aggressor paths. This dependence will now be explained.

Referring to FIG. 3, two neighboring paths of logic, a victim path, and an aggressor path are shown. Assume that an iterative timing analysis has already been performed and that the 'K-factors' have already been calculated for each coupling capacitance in the design. A change in net 4, for instance, affects the timing downstream to that change (i.e., nets 5 and 6). In addition, since the timing of net 4 is changing, its switching window (i.e., the range wherein a transition takes place) will change, and the timing impact of coupling on any nets for which the changed nets are aggressors must be re-analyzed. More specifically, a change in timing in net 4 implies that the K-factors may change between net 1 and net 4, between net 2 and net 5, between net 3 and net 6, and so on. In turn, when nets 1, 2, and 3 are re-analyzed as a result of the change in timing in nets 4, 5, and 6, the nets 1, 2, and 3 to which they are coupled must also be re-analyzed, leading to a repeated analysis throughout the design.

In summary, present design automated optimization tools typically rely on incremental timing to quickly assess changes. Because capacitive coupling is becoming more significant in current and future integrated circuit technologies, designers need optimizers that are aware of the coupling impact on the timing. Since no method is known to exist that is capable of performing incremental coupling-impact-on-timing analysis without iterating over the entire design (causing a large runtime impact), the optimizer does not recognize the impact of its change on the coupled timing, and one is misled into thinking that a change is advantageous.

Without the ability to update timing, including the coupling impact on the timing in a fast incremental manner, run times for coupling-aware timing analysis have become far too cumbersome for use in optimization tools. The closer the optimizer approaches the accuracy of signoff timing analysis (i.e., the timing analysis used to determine whether the final design will satisfy all timing requirements), the less likely it will be that timing problems will be detected during signoff timing analysis, significantly reducing the design turn around time (TAT).

OBJECTS AND SUMMARY OF THE INVENTION

Accordingly, it is an object of invention to improve the accuracy of optimization tools in the design of VLSI chips.

It is another object to effectively update the timing of the design by measuring and determining the impact of coupling on the timing incrementally, on a limited set of nets.

It is still another object to compute the impact of coupling on the timing using previously-computed sensitivities of the delay with respect to changes in effective coupling capacitance.

It is a further object to compute the impact of coupling on the timing using previously-computed sensitivities of the slew with respect to changes in effective coupling capacitance.

It is yet a further object to compute the impact of coupling on the timing using previously-computed switching windows for each aggressor net or neighboring net.

It is still another object to use slack prediction to expand the previously computed switching windows based on the expectation that the more negative the timing slack is in an aggressor net, the higher the impact an optimization tool will have, and the more likely for a change to be observed in the switching windows.

These and other objects of the invention are provided by a method and a system for incrementally calculating the impact of coupling noise on the timing of an integrated circuit. After the circuit timing is calculated, including the impact of coupling noise on the timing, one or more design changes are applied to the circuit. The manner of making the change (for instance, a manual change by the user, or a change by an automated circuit optimization tool) is irrelevant to the present invention. As a result of the change, the system determines by how much the change has impacted the coupling noise on the timing. Unlike the prior art, it performs this calculation based on previously-computed information, including sensitivities of the delay and slew with respect to changes in capacitance. Also, unlike the prior art, it does not perform another complete analysis of the circuit, but limits the analysis to only those nets in the downstream cone of logic from where the change occurred. By way of this incremental analysis, the invention calculates the delay adjust and the slew adjust to be applied to the timing analysis engine for each stage of logic in the downstream cone from where the change took place.

BRIEF DESCRIPTION OF THE DRAWINGS

The accompanying drawings, which are incorporated in and which constitute part of the specification, illustrate the presently preferred embodiments of the invention which, together with the general description given above and the detailed description of the preferred embodiments given below serve to explain the principles of the invention.

DETAILED DESCRIPTION OF THE INVENTION

The present invention and the various features and advantageous details thereof are explained more fully with reference to the non-limiting embodiments that are illustrated in the accompanying drawings and detailed in the following description.

Referring back to FIG. 3, the invention calculates sensitivities of the delay and slew with respect to the change in effective coupling capacitance and stores this information for each coupled victim net (nets 1, 2, 3, 4, 5, and 6). The invention preferably stores away the calculated aggressor switching windows and slews on each coupled aggressor net (nets 1, 2, 3, 4, 5, and 6). The calculation and storage of sensitivities, switching windows, and slews is performed during or based on results from an initial static timing analysis, before changes to the design, such as the gate repowering illustrated in FIG. 3, are performed.

Figure 1:
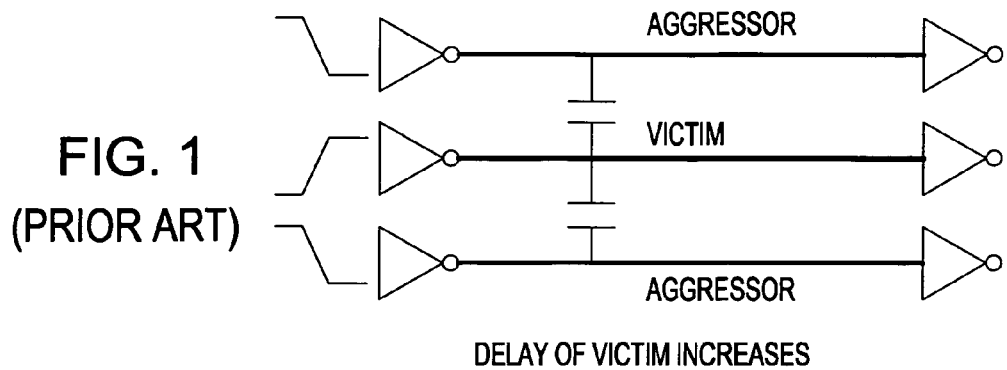
FIG. 1 illustrates prior art schematic of aggressor nets undergoing an opposite transition from the victim net.
Figure 2:
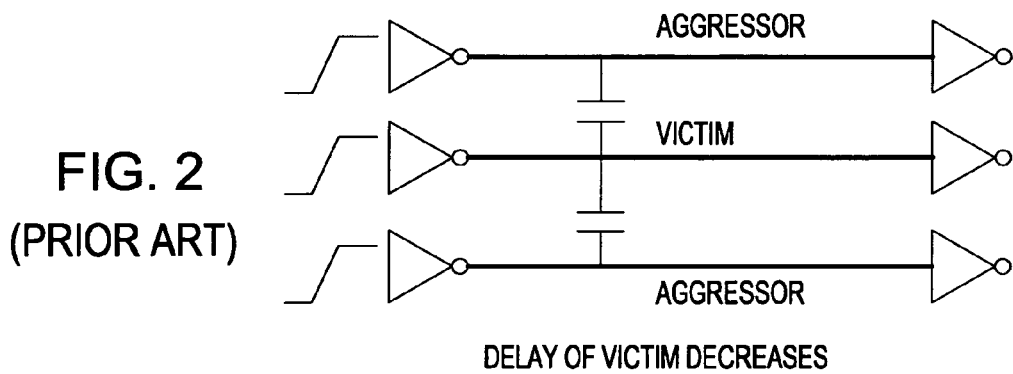
FIG. 2 shows a prior art schematic of aggressor nets undergoing the same direction transition as the victim.
Figure 3:
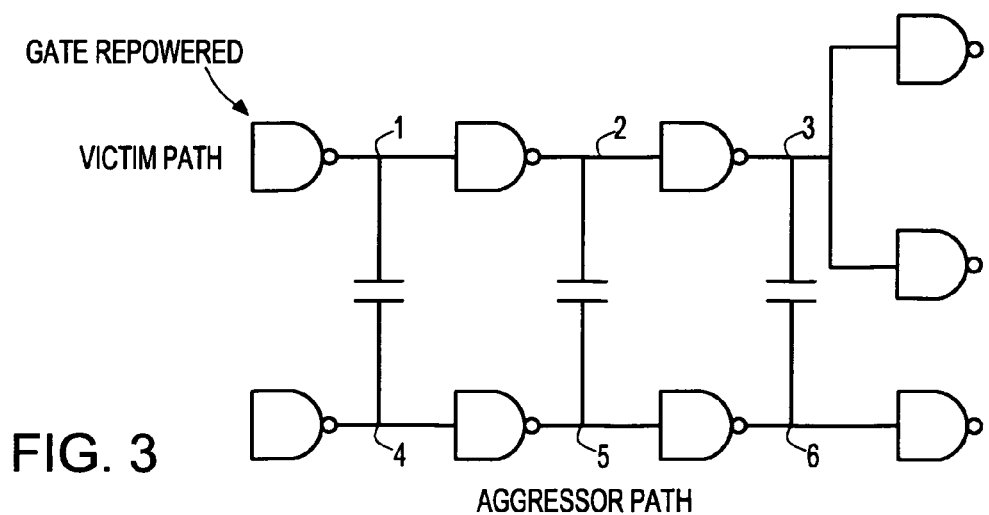
FIG. 3 shows a schematic diagram of two prior art neighboring paths of logic, i.e., the victim path, and the aggressor path, and which illustrates where the optimization tool can perform a design change on the victim path.

Still referring to FIG. 3, as a result of the optimization change on a selected gate, the static timing analysis tool will recalculate its timing information (delays and slews) downstream from where the change occurred (i.e., the gates and nets directly or indirectly fed by the changed gate). To this effect, the selected gate is now repowered.

Figure 4:
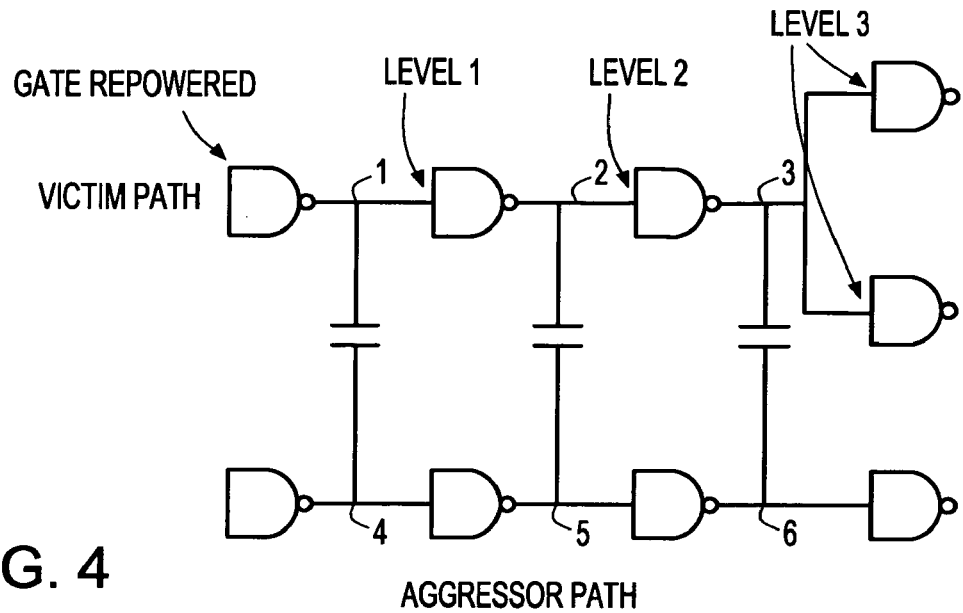
FIG. 4 shows a schematic diagram of a per-stage (gate+wire) of the victim and aggressor paths.

Referring to FIG. 4, a query is made by the static timing analysis tool on each stage of logic, wherein the stage is defined as a driving logic gate with its wire segment(s) being driven. The level numbers shown in FIG. 4 are used during the incremental timing analysis, as described in U.S. Pat. No. 5,508,937 to Abato et al.

Figure 5:
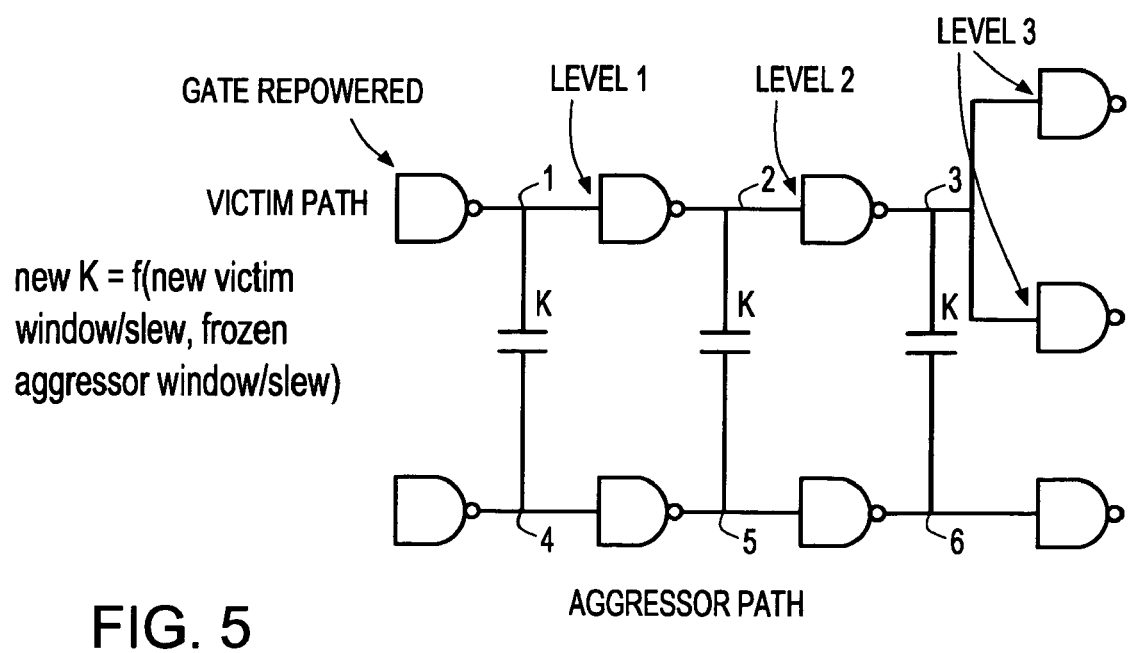
FIG. 5 illustrates how a new K-factor is computed for the per-stage coupling shown in FIG. 4.

Referring to FIG. 5, a new K-factor is calculated based on the current victim switching window and slew (computed by the incremental update function of the static timing analysis tool), and the previously-computed aggressor switching window and slew.

Figure 6:
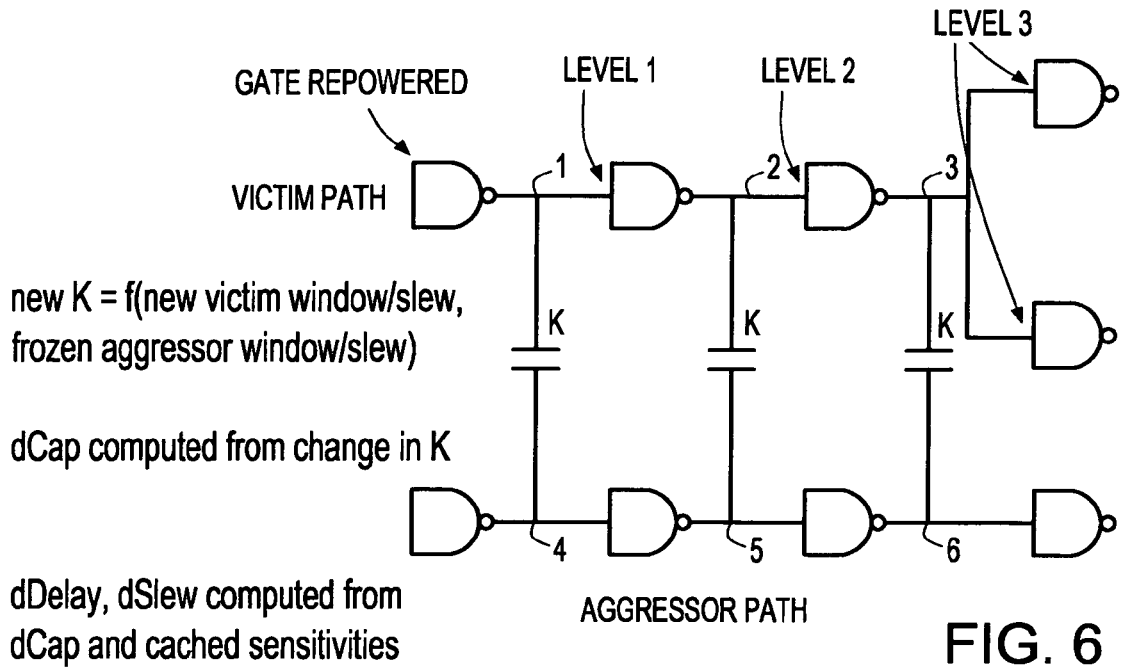
FIG. 6 illustrates the computation of the new K-factor as a function of the new victim window/slew and the frozen aggressor window/slew, from which dCap is computed from a change in K, and where dDelay and dSlew are calculated from dCap and cached sensitivities, in accordance with the present invention.

Referring to FIG. 6, based on the new K-factor, the resulting change in effective coupling capacitance (referenced dCap) is now calculated. From the change in effective capacitance and the previously-computed sensitivities of delay and slew with respect to the change in the effective capacitance, the invention calculates the resulting change in delay (dDelay) and slew (dSlew) due to the ensuing impact on the coupling.

Figure 7:
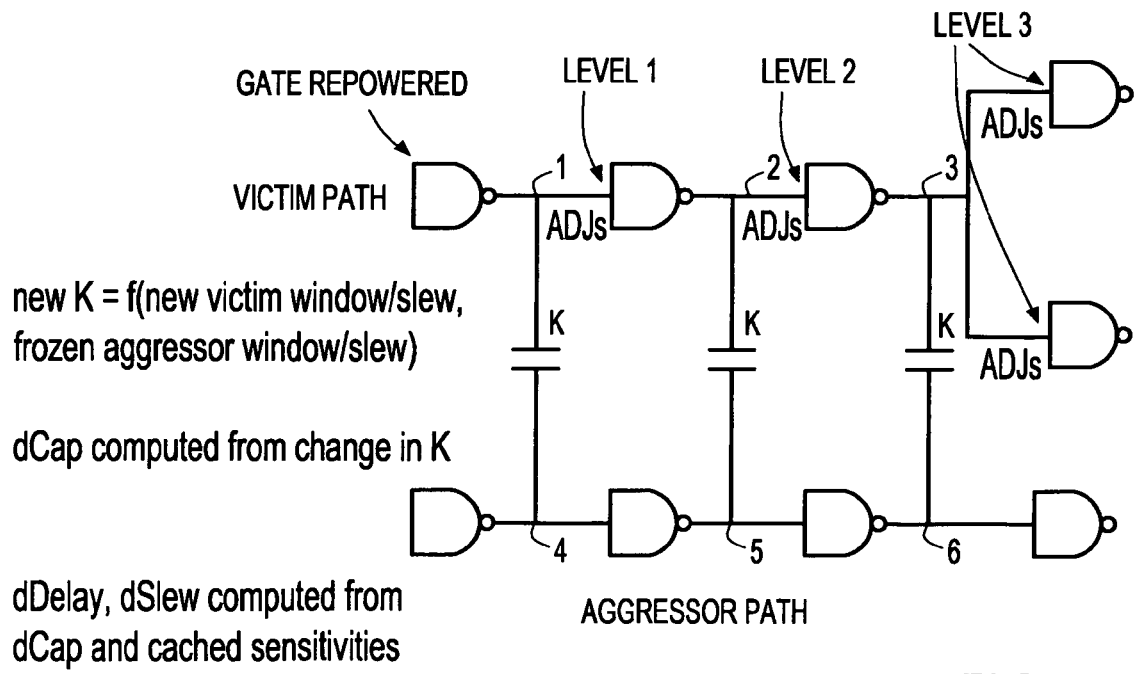
FIG. 7 illustrates where the computed delay and slew adjusts are returned to the static timing analysis tool, showing how the calculations are reflected on the timing and observed by the optimization tool.

Referring to FIG. 7, the delay and slew adjusts are returned to the static timing analysis tool for use in its calculations, and which will be reflected in the timing information handed to the optimization tool.

Figure 8:
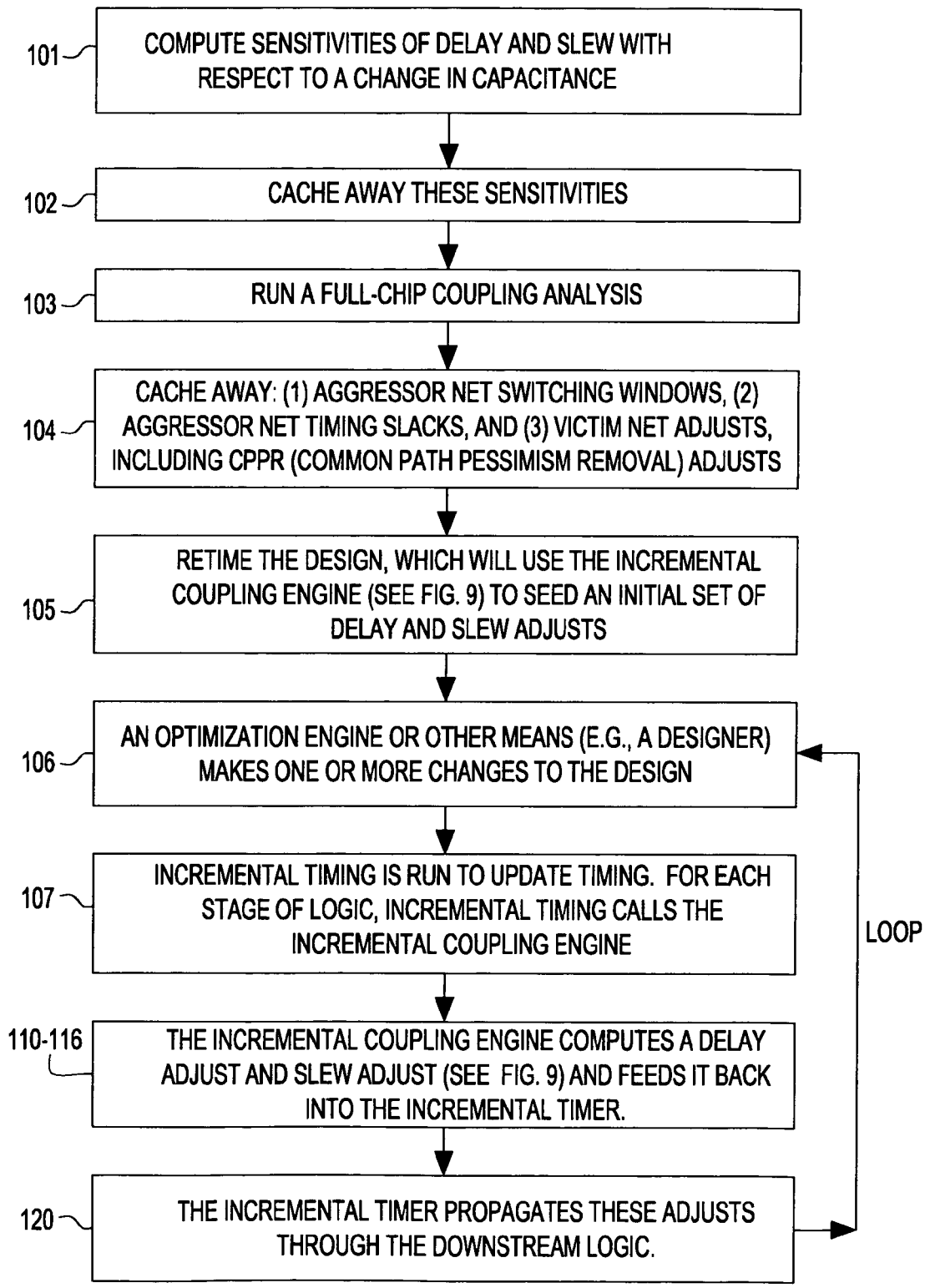
FIG. 8 is a flow chart that describes the sequence of steps that preferably implement the present invention.
Figure 9:
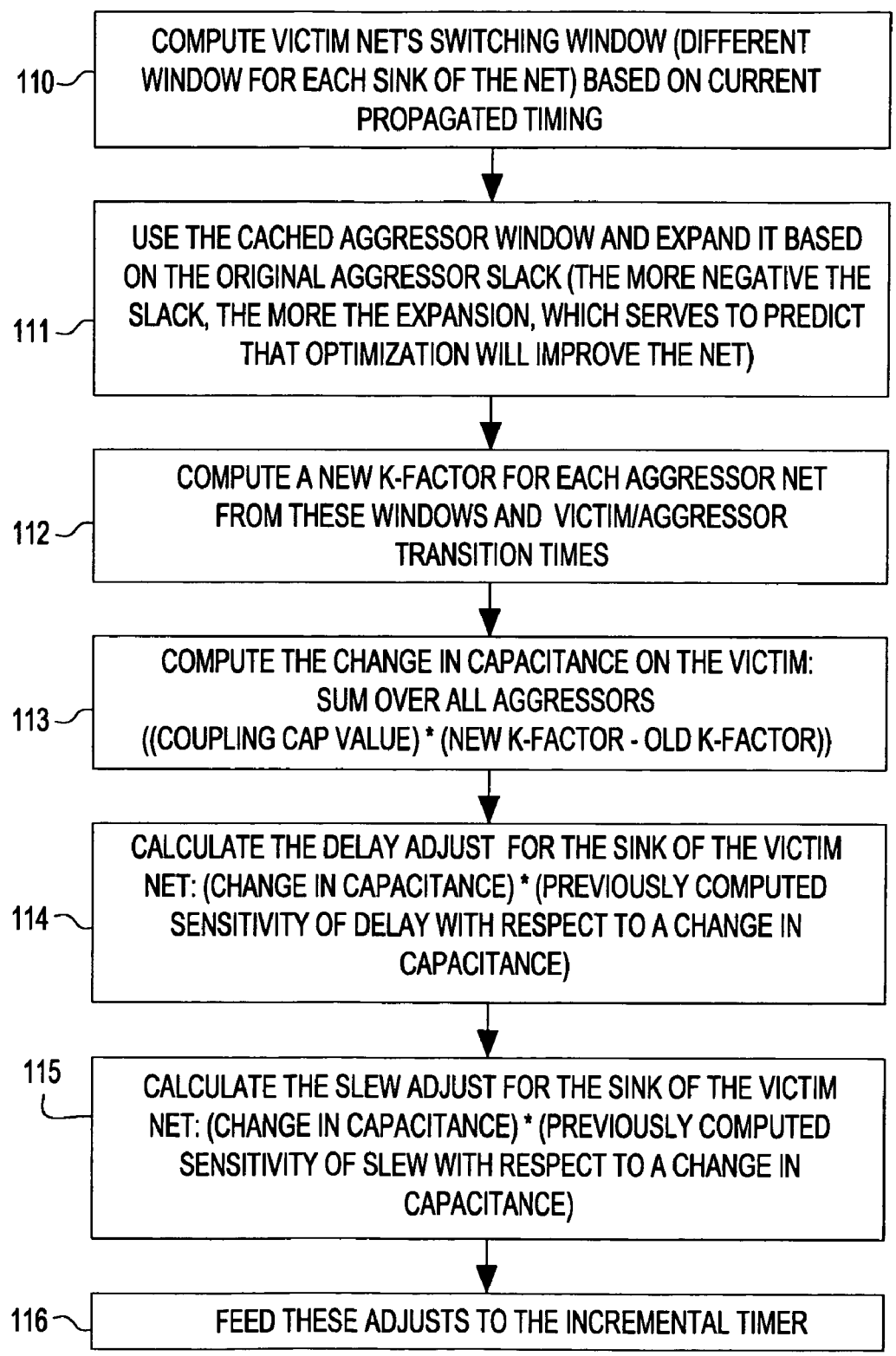
FIG. 9 is a flow chart that describes in more detail the steps included in block 110 of FIG. 8.

A flowchart for the present invention is illustrated in FIGS. 8 and 9, the steps of which will be described in detail. Referring now to FIG. 8 in more detail:

Step 101: An initial worst-case timing analysis is performed using, preferably, the worst-case K-factors of −1 for early-mode and +3 for late-mode (corresponding to $1-K_{prior\_max}$ and $1+K_{prior\_max}$). Then the design is retimed using K-factors of 1 and 1 (corresponding to $K_{prior}=0$), which implies that there is no coupling impact on the timing. For each net in the design, there are two data points for each timing mode (early and late), namely, the delay and slew with no coupling, and the delay and slew with worst-case coupling. The sensitivity of delay and slew are recomputed with respect to a change in capacitance since the change in K-factors is known to be 2.0:

Late-mode:

$$\frac{d\text{Delay}}{d\text{Cap}} = \frac{\text{Delay}(K=3) - \text{Delay}(K=1)}{2 * CouplingCap}$$

-continued $$\frac{d\text{Slew}}{d\text{Cap}} = \frac{\text{Slew}(K=3) - \text{Slew}(K=1)}{2 * CouplingCap}$$

Early-mode:

$$\frac{d\text{Delay}}{d\text{Cap}} = \frac{\text{Delay}(K=1) - \text{Delay}(K=-1)}{2 * CouplingCap}$$

$$\frac{d\text{Slew}}{d\text{Cap}} = \frac{\text{Slew}(K=1) - \text{Slew}(K=-1)}{2 * CouplingCap}$$

Step 102: The sensitivities for each net with coupling in the design are cached. They are assumed to be linear coefficients to be used later in the incremental coupling-impact-on-timing analysis.

Step 103: A full-chip analysis of the impact of coupling on the timing is performed using the algorithm, previously described in U.S. Pat. No. 6,615,395.

Step 104: After the coupling analysis, four items of information are cached away:

(a) the final switching windows on each aggressor net of the design, where the following formula is used to calculate the aggressor switching window:

$$\left(EAT_{Source} - \frac{ESlew_{Source}}{2}\right) \rightarrow \left(LAT_{Sink} + \frac{LSlew_{Sink}}{2}\right),$$

wherein $EAT_{source}$ refers to the early-mode arrival time at the source of the aggressor wire;

$ESlew_{source}$ refers to the early-mode slew or transition time at the source of the aggressor wire;

$LAT_{sink}$ refers to the late-mode arrival time at the sink of the aggressor wire; and $LSlew_{sink}$ refers to the late-mode slew or transition time at the sink of the aggressor wire.

(b) the final timing slacks in each aggressor net in the design;

(c) preferably, any other adjust factors that alters the signal arrival times of victim nets, such as Common Path Pessimism Removal (CPPR) adjusts (CPPR adjust is defined as the difference between slacks computed with and without such a method); and (d) the final transition times in each aggressor net in the design. One embodiment of the CPPR algorithm is described in U.S. Pat. No. 5,636,372, and in Patent Application Publication US 2005/0066297A1 to Bergman Reuter et al.

This information is required later on during the incremental coupling-impact-on-timing analysis.

Step 105: The entire design is retimed with the incremental coupling engine enabled. Preferably, the level-limiting algorithm is advantageously used as described in U.S. Pat. No. 5,508,937, so that only the computations are made that are needed to answer the query made to the timing analyzer. At each net in the design, the timing analysis engine calls the incremental coupling engine (hereinafter described in Steps 110-116 in FIG. 9). This step is required to ensure consistent timing, i.e., where the initial timing analysis results (including the coupling impact) match the timing analysis results after doing and undoing a design change. This is critical for supporting optimization tools. The base incremental timing engine used is described in U.S. Pat. No. 5,508,937. Optionally, in this step, the aggressor windows may be extended to anticipate timing improvements that may subsequently be made to the aggressor net.

Step 106: One or more changes are then made to the design by some mechanism, for example, by the optimization engine or the designer. This may include a trial change to the design which requires that timing analysis results be updated to gauge the impact on the timing (which must include coupling).

Step 107: The normal incremental timing analysis engine retimes only the necessary nets that are affected by the change(s) in Step 106. At each net in the retiming, the incremental coupling engine will be referenced as in Step 105 to compute a delta-delay and delta-slew, i.e., the change in delay and slew in the net due to the new coupling impact. (Steps 110-116 will describe this in detail hereinafter since this is the main aspect of the invention). Note that the impacts of the change are propagated forward and backward through the circuitry fed by the change location(s) and feeding the change locations(s). However, they are not propagated laterally to other nets coupled to the change location(s) or to nets fed by the change location(s).

Step 110: For each sink pin in the net, the current propagated timing information (arrival times and slews) is preferably used to calculate the victim net switching window. The following equation is used to perform this calculation:

$$\left(AT_{Source} - \frac{Slew_{Source}}{2}\right) \rightarrow \left(AT_{Source} + Delay_{Wire} + \frac{Slew_{Sink}}{2}\right)$$

wherein $AT_{source}$ is the arrival time at the source of the wire;

$Slew_{source}$ is the slew or transition time at the source of the wire; and $Slew_{sink}$ is the slew or transition time at the sink of the wire:

Using the cached CPPR or other victim adjusts (Step 104c) the victim switching window is expanded to account for possible impacts on the timing (early mode/late mode timing split). Specifically, the beginning of an early mode victim switching window will be moved earlier by the adjust value, and the end of the late mode victim switching window will be moved later by this adjust value.

Step 111: For each aggressor net coupled to the victim, a cached aggressor switching window is used (Step 104a). Optionally, each end of the window may be extended by the cached aggressor slack if the slack is negative (Step 104b). Specifically, the beginning of a late mode aggressor arrival time window with negative slack will be moved earlier by the negative of the slack, and the end of an early mode aggressor arrival time will be moved later by the negative of the slack. The rationale is that, the more negative the slack is, the more effort the optimization tool will put into fixing the net. Since the aggressor windows are cached (frozen, cannot change) one may use the slack to predict by how much the aggressor switching window may change due to design changes.

Alternatively, one may expand the aggressor window by the amount of delta slack, calculated as (current slack—original cached slack). This serves to calculate by how much the window may have shifted as a result of the design changes.

Alternatively, one may expand the window aggressor window by the minimum of {the negative of the original cached slack} and {the delay flexibility of the upstream logic of the aggressor}, wherein delay flexibility is defined as the ability of the arrival time (AT) to be changed upstream of the aggressor (i.e., in the gates and nets directly or indirectly feeding the aggressor). This serves to predict by how much the aggressor window may change in the future.

Step 112: From the windows (Steps 110, 111), the cached transition times in the aggressor (Step 104d) and the current propagated transition times in the victim, one calculates a new K-factor for each aggressor net. The following formula describes how to calculate the K-factor, Late mode $K =$
$$1.0 + \frac{\min(Ov, Ta, Tv)}{Ta} * \min\left(2.0, \frac{Tv}{\min(Ov, Ta, Tv)}\right) * \frac{Vdd(A)}{Vdd(V)}$$

Early mode $K =$
$$1.0 - \frac{\min(Ov, Ta, Tv)}{Ta} * \min\left(2.0, \frac{Tv}{\min(Ov, Ta, Tv)}\right) * \frac{Vdd(A)}{Vdd(V)}$$

wherein

Ta represents the aggressor transition time or slew;
Tv represents the victim transition time or slew;
Ov represents the amount of overlap between the switching windows of the victim and aggressor, Vdd (A) represents the voltage swing of the aggressor net; and
Vdd (V) represents the voltage swing of the victim net.

The magnitude of the calculated K-factor reflects the amount of coupling noise impact on the timing; K-factors close to 1.0 imply little impact, whereas K-factors farther away from 1.0 imply a larger impact.

Step 113: The total change in effective capacitance in the victim is then computed and summed over all aggressors as the follows:

Effective coupling capacitance value*(new K-factor–K-factor from the initial analysis)

Step 114: Sensitivities from Step 102 are used together with the change in effective capacitance from Step 113, to compute the change in delay:

Change in delay=Change in effective capacitance (Step 113)*Previously-cached sensitivity of delay with respect to the change in effective capacitance (Step 102)

Step 115: The sensitivities from Step 102 are used together with the change in capacitance from Step 113, to compute the change in slew as follows:

Change in slew=Change in effective capacitance (Step 113)*Previously-cached sensitivity of slew with respect to the change in effective capacitance (Step 102)

Step 116: The adjusts from Steps 114 and 115 are given back to the incremental timing analysis engine and are added to the current propagated delays and slews.

Step 120: The incremental timing engine will take these adjusts and propagate them through to the next level of logic, and so on, so the timing everywhere includes the impact of coupling.

Note that Steps 101 and 102 are optional, and that in this case Steps 114, 115, and 116 are replaced by computation of updated delays and slews using the normal delay computation method of the static timing analyzer.

An example which illustrates in more detail the present invention and which shows how to calculate a late-mode change in the delay and changes in the slew will now be described.

Referring back to FIG. 3, that illustrates a simple capacitive coupled circuit showing the victim path and the aggressor path, and with reference to Step 101, Step 101: Assuming that the coupling capacitance between net 1 and net 4 is 2 pf.

The delay of net 1 at K=3 is 50 ps. Its delay at K=1 is 45 ps.
The slew of net 1 at K=3 is 100 ps. Its slew at K=1 is 80 ps.
The sensitivity of delay in net1 due to a change in effective capacitance is (50–45)/(2*2)=1.25 ps/pf.
The sensitivity of slew in net1 due to a change in effective capacitance is (100–80)/(2*2)=5 ps/pf.

Assuming that the coupling capacitance between net 2 and net 5 is 5 pf.

The delay of net 2 at K=3 is 60 ps. Its delay at K=1 is 40 ps.
The slew of net 2 at K=3 is 110 ps. Its slew at K=1 is 90 ps.
The sensitivity of delay in net 2 due to a change in effective capacitance is (60–40)/(2*5)=2 ps/pf.
The sensitivity of slew in net 2 due to a chance in effective capacitance is (110–90)/(2*5)=2 ps/pf.

Step 102: The four sensitivity values are cached away.

Step 103: A full-chip analysis is performed to calculate the impact of coupling on the timing.

Step 104: The information is cached away following Step 103.

(a) Assume the aggressor window of net 4 is calculated at {1 ps to 2 ps}.
Assume the aggressor window of net 5 is calculated at {3 ps to 5 ps}.
(b) Assume the slack in net 4 is calculated to be –50 ps.
Assume the slack in net 5 is calculated to be –25 ps.
(c) Assume the total adjust in net 1 is 0.5 ps.
Assume the total adjust in net 2 is 0.3 ps.
(d) Assume the transition time in net 4 is calculated to be 40 ps.
Assume the transition time in net 5 is calculated to be 50 ps.

All this information is cached away for later use.

Step 105: The design is retimed, using the incremental coupling analysis engine (see Steps 110-116).

Referring back to FIG. 3, showing where a logic change that was made as described in Step 106.

Referring back to FIG. 4, the incremental timing engine calls the incremental coupling engine.

Step 107: First, the incremental timer will process net 1. The incremental coupling analysis engine will calculate a change in delay and change in slew.

Using the adjusted delays and slews, the incremental timer will next process net 2. The incremental coupling analysis engine will calculate a change in delay and slew.

Using those adjusted delays and slews, the incremental timer will next process net 3. The incremental coupling analysis engine will calculate a change in delay and slew.

Referring now to FIG. 5, there are shown the new K-factors being calculated.

Step 110: Assume that the current window in net 1 is {1.5 ps to 2.2 ps}, and the current slew in net 1 is 50 ps. From the cached adjust (Step 104c), the window is expanded to {1.5 ps to 2.7 ps}.

Assume the calculated window in net 2 is {2.5 ps to 3.4 ps}. (This window is impacted by the change in delay and slew of net 1 calculated by the present algorithm). Assume the current slew in net 2 is 60 ps. From the cached adjust (Step 104c), the window is expanded to {2.5 ps to 3.7 ps}.

Step 111: Assume that the first aggressor window expansion approach defined in (Step 110) is followed.

From Step 104a, the cached aggressor window of net 4 was {1 ps to 2 ps}, expanding the beginning of the window by the negative of the cached slack (Step 104b), i.e., 50 ps. The new aggressor window becomes {–49 ps to 2 ps}.

Similarly, the cached aggressor window of net 5 was {3 ps to 5 ps}. The starting point of the window is expanded by 25 ps. And the new aggressor window becomes {−22 ps to 5 ps}.

Step 112: Assume the voltage swings are 1.0 for all the nets in the design, and further that the transition time in net 1 is 70 ps while the transition time in net 2 is 80 ps. Then, the new K-factor calculated between net 1 and net 4 is determined based on the victim window in (Step 110), the aggressor window from (Step 111), and the cached aggressor transition times from (Step 104d). The overlap between the victim and aggressor windows is calculated as 0.5 ps in this example. U.S. Pat. No. 6,615,395 describes the K-factor calculation in detail. The K-factor is calculated to be 1.025. Similarly the new K-factor is calculated between net 2 and net 5 based on the same information. The overlap is calculated to be 2.5 ps, and the K-factor is calculated to be 1.1.

Referring now to FIG. 6, there is shown the values of delta-delay and delta-slew are determined.

Step 113: The total change in effective capacitance in each victim is calculated next. Assuming that all the K-factors were previously 1.0, then, one uses the amount of coupling capacitance in each aggressor, and the new K-factor is calculated (Step 112).

net 1:2 pf*(1.025−1.0)=0.05 pf net 2:5 pf*(1.1−1.0)=0.5 pf

Step 114: The change in delay i each victim due to the change in effective capacitance is determined next. This depends on the change in effective capacitance (Step 113) and the cached sensitivity of delay due to change in effective capacitance (Step 101).

net 1:0.05 pf*1.25 ps/pf=0.0625 ps net 2:0.5 pf*2 ps/pf=1.0 ps

Step 115: The change in slew in each victim due to the change in effective capacitance is now calculated. This depends on the change in effective capacitance (Step 113) and the cached sensitivity of slew due to the change in effective capacitance (Step 101).

net 1:0.05 pf*5 ps/pf=0.25 ps net 2:0.5 pf*2 ps/pf=1.0 ps

Step 116: FIG. 7 shows where the delay and slew adjustments are applied, and fed back to the incremental timer. After computing the Level 1 adjusts through the incremental coupling engine, the incremental timer propagates them through to Level 2 (Step 120). After computing the Level 2 adjustment through the incremental coupling engine, the incremental timer propagates them through to Level 3 (Step 120), and subsequent levels, through the entire design.

A hardware configuration is preferably used for practicing the present invention, preferably by way of a conventional computer (not shown) having one or more central processing units (CPU). The CPU is preferably interconnected by way of a system bus to a random access memory (SRAM), a read-only memory (ROM), input/output adapters for connecting to peripheral devices, such as disk units and tape drives to a bus, a user interface adapter for connecting a keyboard, a mouse, a speaker, a microphone, and the like, and a set of communication adapters for connecting the information handling system to a data processing network, and display adapter for connecting the bus to a display device. A program storage device readable by the disk or tape units, may be advantageously used to load the instructions which operate the invention and which is also loaded into the computer system.

While the present invention has been particularly described in conjunction with a specific preferred embodiment, it is evident that many alternatives, modifications and variations will be apparent to those skilled in the art in light of the present description. It is therefore contemplated that the appended claims will embrace any such alternatives, modifications and variations as falling within the true scope and spirit of the present invention.

What is claimed is:

1. A method of incrementally calculating an impact of coupling noise on timing of an integrated circuit (IC) design comprised of a plurality of logic stages, the method comprising:
   a) performing an initial timing analysis on the integrated circuit design by calculating sensitivity of delay and slew respectively as a function of a change in effective coupling capacitance to determine a first impact of the coupling noise on the timing on at least one victim stage of the integrated circuit design;
   b) performing at least one design change on the IC design;
   c) responsive to the at least one design change, calculating a second impact of the coupling noise on the timing of at least one victim stage where the at least one design change was made and downstream thereof; and
   d) providing results of the calculated second impact to a timing analysis tool to adjust a delay and slew of the at least one victim stage where the at least one design change was made and downstream thereof.

2. The method as recited in claim 1, wherein the timing analysis tool supports a level limiting algorithm.

3. The method as recited in claim 1, further comprising inputting to an optimization tool the adjusted delay and slew.

4. The method as recited in claim 1 wherein in the step a) results of a first impact determination on each coupled victim net are stored in a cache.

5. The method as recited in claim 1, wherein the step a) further comprises calculating victim switching windows and slews in at least one coupled aggressor net of the integrated circuit design and storing results thereof.

6. The method as recited in claim 1, wherein the step a) further comprises calculating at least one coupled victim net's timing slack and storing results thereof.

7. The method as recited in claim 1, wherein the step a) further comprises storing any timing adjusts which impact an arrival time of the at least one victim stage.

8. A method of incrementally calculating an impact of coupling noise on timing of an integrated circuit (IC) design comprised of a plurality of logic stages, the method comprising:
   a) performing an initial timing analysis on the integrated circuit design to determine a first impact of the coupling noise on the timing on at least one victim stage of the integrated circuit design;
   b) performing at least one design change on the IC design;
   c) responsive to the at least one design change, calculating a second impact of the coupling noise on the timing of at least one victim stage where the at least one design change was made and downstream thereof;
   d) providing results of the calculated second impact to a timing analysis tool to adjust a delay and slew of the at least one victim stage where the at least one design change was made and downstream thereof; and
   e) calculating a new K-factor based on a current victim switching window and slew, and a previously-computed aggressor switching window and slew.

9. The method as recited in claim 8, wherein the new K-factor is computed by a static timing analysis tool.

10. The method as recited in claim 8, wherein based on the new K-factor, a change in effective coupling capacitance is calculated.

11. The method as recited in claim 8, wherein from the change in effective coupling capacitance, and previously-computed sensitivities of the delay and slew with respect to the change in effective capacitance, a resulting change in the delay (dDelay) and slew (dSlew) due to an impact on the coupling is calculated.

12. The method as recited in claim 8, wherein the current victim switching window is expanded based on the stored adjusts.

13. The method as recited in claim 8, wherein the previously computed aggressor switching window is expanded.

14. The method as recited in claim 13, wherein an amount of the expansion is based on a current slack on a coupled aggressor net.

15. The method as recited in claim 13, wherein an amount of the expansion is based on a previously computed slack on a coupled aggressor net.

16. The method as recited in claim 13, wherein an amount of the expansion is based on a delay flexibility of an upstream logic stage of a coupled aggressor net.

17. A system for incrementally calculating an impact of coupling noise on timing of an integrated circuit (IC) comprised of a plurality of logic stages, the system comprising:
   a) means for performing an initial timing analysis on the IC by calculating sensitivity of delay and slew respectively as a function of a change in effective coupling capacitance to determine a first impact of the coupling noise on the timing;
   b) means for performing at least one design change on the IC;
   c) responsive to the at least one design change, means for calculating a second impact of the coupling noise on the timing of at least one logic stage where the at least one design change was made and downstream thereof; and
   d) means for providing results of the calculated second impact to a timing analysis tool to adjust a delay and slew of the at least one logic stage where the at least one design change was made and downstream thereof.

18. A program storage device readable by a machine, tangibly, embodying a program of instructions executable by the machine to perform method steps for incrementally calculating an impact of coupling noise on timing of an integrated circuit (IC) comprised of a plurality of logic stages, said method steps comprising:
   a) performing an initial timing analysis on the IC by calculating sensitivity of delay and slew respectively as a function of a change in effective coupling capacitance to determine a first impact of the coupling noise on the timing;
   b) performing at least one design change on the IC;
   c) responsive to the at least one design change, calculating a second impact of the coupling noise on the timing of at least one logic stage where the at least one design change was made and downstream thereof; and
   d) providing the results of the calculated second impact to a timing analysis tool to adjust a delay and slew of the at least one logic stage where the at least one design change was made and downstream thereof.

* * * * *